(12) United States Patent
Ochi

(10) Patent No.: US 11,848,170 B2
(45) Date of Patent: *Dec. 19, 2023

(54) ION GENERATOR AND ION IMPLANTER

(71) Applicant: SUMITOMO HEAVY INDUSTRIES ION TECHNOLOGY CO., LTD., Tokyo (JP)

(72) Inventor: Syuta Ochi, Ehime (JP)

(73) Assignee: SUMITOMO HEAVY INDUSTRIES ION TECHNOLOGY CO, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/836,109

(22) Filed: Jun. 9, 2022

(65) Prior Publication Data

US 2022/0301808 A1   Sep. 22, 2022

Related U.S. Application Data

(63) Continuation of application No. 16/818,675, filed on Mar. 13, 2020, now Pat. No. 11,380,512.

(30) Foreign Application Priority Data

Mar. 18, 2019   (JP) ................................. 2019-049842

(51) Int. Cl.
  *H01J 37/08*   (2006.01)
  *H01J 37/317*   (2006.01)
  (Continued)

(52) U.S. Cl.
  CPC ............ *H01J 37/08* (2013.01); *H01J 37/063* (2013.01); *H01J 37/3171* (2013.01);
  (Continued)

(58) Field of Classification Search
  CPC ...... H01J 37/08; H01J 37/063; H01J 37/3171; H01J 37/32385; H01J 37/32788; H01J 2237/082
  See application file for complete search history.

(56) References Cited

U.S. PATENT DOCUMENTS 5,497,006 A   3/1996   Sferlazzo et al.
7,655,924 B2   2/2010   Goldberg et al.
(Continued)

FOREIGN PATENT DOCUMENTS

JP   H08-227688 A   9/1996
JP   2001-167707 A   6/2001
(Continued)

*Primary Examiner* — Nicole M Ippolito
*Assistant Examiner* — Hanway Chang
(74) *Attorney, Agent, or Firm* — Michael Best & Friedrich LLP

(57) ABSTRACT

An ion generator includes an arc chamber defining a plasma generation space, and a cathode which emits thermoelectrons toward the plasma generation space. The arc chamber includes a box-shaped main body having an opening, and a slit member mounted to cover the opening and provided with a front slit. An inner surface of the main body is exposed to the plasma generation space made of a refractory metal material. The slit member includes an inner member made of graphite and an outer member made of another refractory metal material. The outer member includes an outer surface exposed to an outside of the arc chamber. The inner member includes an inner surface exposed to the plasma generation space, and an opening portion which forms the front slit extending from the inner surface of the inner member to the outer surface of the outer member.

14 Claims, 7 Drawing Sheets

(51) Int. Cl.
*H01J 37/063* (2006.01)
*H01J 37/32* (2006.01)

(52) U.S. Cl.
CPC .. *H01J 37/32385* (2013.01); *H01J 37/32788* (2013.01); *H01J 2237/082* (2013.01)

(56) References Cited

U.S. PATENT DOCUMENTS

| | | |
|---|---|---|
| 8,153,993 B2 | 4/2012 | Goldberg et al. |
| 9,208,983 B2 | 12/2015 | Sato |
| 9,659,749 B2 | 5/2017 | Sato |
| 11,380,512 B2 * | 7/2022 | Ochi ................. H01J 37/32422 |
| 2018/0144904 A1 | 5/2018 | Colvin et al. |

FOREIGN PATENT DOCUMENTS

| | | |
|---|---|---|
| JP | 2001-227688 A | 8/2001 |
| JP | 2010-521765 A | 6/2010 |
| JP | 2014-044886 A | 3/2014 |
| JP | 2016-081753 A | 5/2016 |
| JP | 2018-067475 A | 4/2018 |

* cited by examiner

ION GENERATOR AND ION IMPLANTER

RELATED APPLICATIONS

This is a continuation of application Ser. No. 16/818,675 filed on Mar. 13, 2020, the contents of which, including the specification, the claims and the drawings, are incorporated herein by reference in their entirety. The contents of Japanese Patent Application No. 2019-049842, on the basis of which priority benefits are claimed in an accompanying application data sheet, including the claims, the specification and the drawings, are incorporated herein by reference in their entirety.

BACKGROUND

Technical Field

Certain embodiments of the present invention relate to an ion generator and an ion implanter.

Description of Related Art

In a semiconductor manufacturing process, for the purpose of changing the conductivity of a semiconductor, the purpose of changing the crystal structure of the semiconductor, or the like, a process of implanting ions into a semiconductor wafer is carried out standardly. An apparatus which is used in this process is generally called an ion implanter. In such an ion implanter, ions are generated by an ion generator provided with an indirectly heated cathode structure and an arc chamber. The generated ions are extracted to the outside of the arc chamber through an extraction electrode.

SUMMARY

According to an embodiment of the present invention, there is provided an ion generator including: an arc chamber which defines a plasma generation space; a cathode which emits thermoelectrons toward the plasma generation space; and a repeller which faces the cathode with the plasma generation space interposed therebetween, wherein the arc chamber includes a box-shaped main body in which a front side is open, and a slit member which is mounted to the front side of the main body and provided with a front slit for extracting ions, an inner surface of the main body which is exposed to the plasma generation space is made of a refractory metal material, and an inner surface of the slit member which is exposed to the plasma generation space is made of graphite.

According to another embodiment of the present invention, there is provided an ion implanter including: the ion generator according to the above embodiment; a beam acceleration unit that accelerates an ion beam which is extracted from the ion generator to have an energy of 1 MeV or higher; and an implantation process chamber in which a wafer is irradiated with an ion beam which exits from the beam acceleration unit.

DETAILED DESCRIPTION

Figure 1:
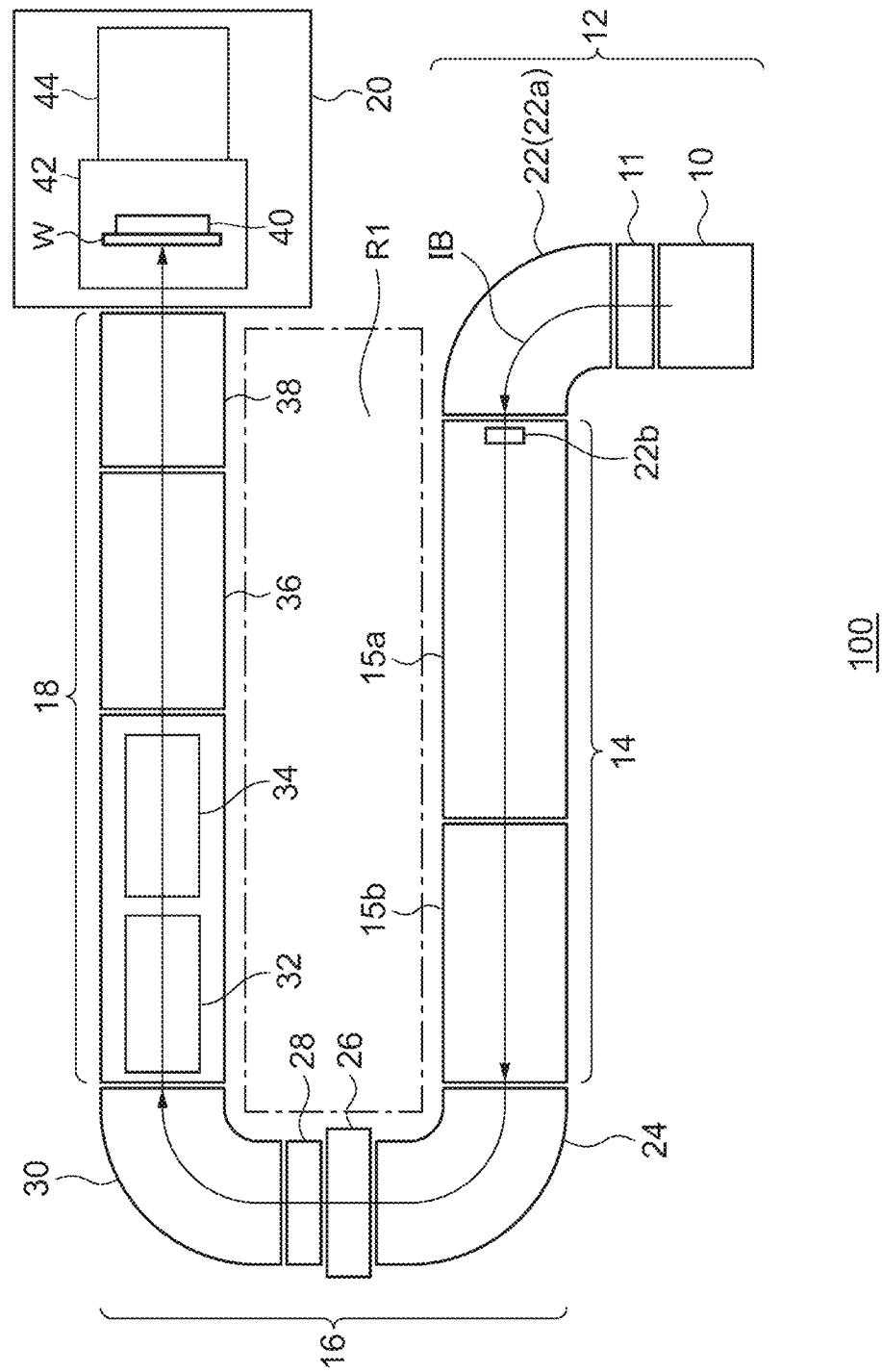
FIG. 1 is a top view showing a schematic configuration of an ion implanter according to an embodiment.

In recent years, there is a case where it is required to generate a high-energy ion beam in order to implant ions into a deeper region of a wafer surface. In order to generate the high-energy ion beam, it is necessary to generate multiply charged ions in an ion generator and accelerate the multiply charged ions by using a direct-current acceleration mechanism or a radio frequency acceleration mechanism (for example, a linear acceleration mechanism). In a case of generating a sufficient amount of multiply charged ions in the ion generator, it is necessary to increase an arc voltage or an arc current, and thus wear of an arc chamber or an electric discharge between the arc chamber and an extraction electrode can become more prominent. Under such a condition, mixing of contamination due to the wear of the arc chamber, damage to an apparatus due to the electric discharge, or the like can become problematic.

It is desirable to provide an ion generator in which it is possible to suppress mixing of contamination and damage due to an electric discharge under a condition that generate more multiply charged ions.

Any combination of the constituent elements described above, or replacement of constituent elements or expressions of the present invention with each other between methods, apparatuses, systems, or the like is also valid as an aspect of the present invention.

According to the present invention, an ion generator capable of stably generating high-purity multiply charged ions can be provided.

Hereinafter, modes for carrying out the present invention will be described in detail with reference to the drawings. In the descriptions of the drawings, the same elements are denoted by the same reference numerals, and overlapping descriptions are omitted appropriately. Further, the configuration described below is an exemplification and does not limit the scope of the present invention.

FIG. 1 is a top view showing a schematic configuration of an ion implanter 100 according to an embodiment. The ion implanter 100 is a so-called high-energy ion implanter. The ion implanter 100 extracts and accelerates ions generated in an ion generator 10 to generate an ion beam IB, transports the ion beam IB to an object to be processed (for example, a substrate or a wafer W) along a beamline, and implants the ions into the object to be processed.

The ion implanter 100 includes a beam generation unit 12 that generates and mass-separates ions, a beam acceleration unit 14 that further accelerates the ion beam IB to obtain a high-energy ion beam, a beam deflection unit 16 that performs energy analysis, energy dispersion control, trajectory correction of the high-energy ion beam, and a beam transport unit 18 that transports the analyzed high-energy ion beam to the wafer W, and a substrate transferring/processing unit 20 in that the transported high-energy ion beam is implanted into a semiconductor wafer.

The beam generation unit 12 includes the ion generator 10, an extraction electrode 11, and a mass analyzer 22. In the beam generation unit 12, ions are extracted from the ion generator 10 through the extraction electrode 11 and accelerated at the same time, and the extracted and accelerated ion beam is subjected to mass analysis by the mass analyzer 22. The mass analyzer 22 includes a mass analyzing magnet 22a and a mass resolving aperture 22b. As a result of the mass analysis by the mass analyzer 22, ion species necessary for implantation are selected, and an ion beam of the selected ion species is led to the following beam acceleration unit 14.

The beam acceleration unit 14 includes a plurality of linear accelerators that accelerate the ion beam, that is, one or more radio frequency resonators. The beam acceleration unit 14 is a radio frequency acceleration mechanism that accelerates ions by the action of a radio frequency (RF) electric field. The beam acceleration unit 14 includes a first linear accelerator 15a which is provided with standard multiple-stage radio frequency resonators, and a second linear accelerator 15b which is provided with additional multiple-stage radio frequency resonators for high-energy ion implantation. The direction of the ion beam accelerated by the beam acceleration unit 14 is changed by the beam deflection unit 16.

The high-energy ion beam which exits from the beam acceleration unit 14 has a certain range of energy distribution. For this reason, in order to irradiate the wafer with the high-energy ion beam that is reciprocally scanned and parallelized downstream of the beam acceleration unit 14, it is necessary to carry out high-accuracy energy analysis, trajectory correction, and adjustment of beam convergence and divergence in advance.

The beam deflection unit 16 performs the energy analysis, energy dispersion control, and trajectory correction of the high-energy ion beam. The beam deflection unit 16 includes at least two high-accuracy bending electromagnets, at least one energy width limiting slit, at least one energy resolving aperture, and at least one laterally focusing device. The plurality of bending electromagnets are configured to perform the energy analysis of the high-energy ion beam and accurate correction of an ion implantation angle.

The beam deflection unit 16 includes an energy analyzing electromagnet 24, a laterally focusing quadrupole lens 26 that suppresses energy dispersion, an energy resolving aperture 28, and a bending electromagnet 30 that provides beam steering (ion beam trajectory correction). The energy analyzing electromagnet 24 is sometimes referred to as an energy filter electromagnet (EFM). The high-energy ion beam is subjected to a direction change by the beam deflection unit 16 to travel toward the wafer W.

The beam transport unit 18 is a beamline unit that transports the ion beam IB exited from the beam deflection unit 16, and includes a beam shaper 32 composed of a focusing/defocusing lens group, a beam scanner 34, a beam parallelizer 36, and a final energy filter 38 (including a final energy separation slit). The length of the beam transport unit 18 is designed in accordance with the total length of the beam generation unit 12 and the beam acceleration unit 14, and the beam transport unit 18 is connected to the beam acceleration unit 14 with the beam deflection unit 16 to form a U-shaped layout as a whole.

The substrate transferring/processing unit 20 is provided at the terminus on the downstream side of the beam transport unit 18. The substrate transferring/processing unit 20 includes an implantation process chamber 42 and a substrate transfer unit 44. The implantation process chamber 42 is provided with a platen driving device 40 that holds the wafer W which is being subjected to ion implantation, and moves the wafer W in a direction perpendicular to a beam scanning direction. The substrate transfer unit 44 is provided with a wafer transfer mechanism such as a transfer robot for loading the wafer W before the ion implantation into the implantation process chamber 42 and unloading the ion-implanted wafer W from the implantation process chamber 42.

The ion generator 10 is configured to generate, for example, multiply charged ions of boron (B), phosphorus (P), or arsenic (As). The beam acceleration unit 14 accelerates the multiply charged ions extracted from the ion generator 10 and generates a high-energy ion beam of 1 MeV or higher or 4 MeV or higher. By accelerating the multiply charged ions (for example, doubly charged ions, triply charged ions, quadruply charged ions or higher), a high-energy ion beam can be generated more efficiently than in a case of accelerating singly charged ions.

The beam acceleration unit 14 may not be a two-stage linear accelerator as illustrated, and may be configured as a single linear accelerator as a whole, or may be configured to be divided into three or more stages of linear accelerators. Further, the beam acceleration unit 14 may be configured with any other type of acceleration unit, and may be provided with a direct-current acceleration mechanism, for example. This embodiment is not limited to a specific ion acceleration method, and any beam acceleration unit can be adopted as long as it can generate a high-energy ion beam of 1 MeV or higher or 4 MeV or higher.

According to the high-energy ion implantation, since desired impurity ions are implanted into the wafer surface with a higher energy than in the ion implantation of an energy of less than 1 MeV, it is possible to implant desired impurities into a deeper region (for example, a depth of 5 μm or more) on the wafer surface. The high-energy ion implantation is used for, for example, the formation of P-type regions and/or N-type regions in the manufacture of semiconductor devices such as the newest image sensors.

The ion generator 10 according to this embodiment is a type using a so-called indirectly heated cathode (IHC) and generates arc discharge in an arc chamber to generate multiply charged ions. In order to generate multiply charged ions, it is necessary to increase an arc voltage or an arc current in order to strip more electrons from atoms. Under such an arc condition, wear of the interior of the arc chamber becomes severe, and there is a high possibility that a part of a member configuring the inner wall of the arc chamber may also be ionized and extracted to the outside of the arc chamber. As a result, the ion beam IB in which the constituent members of the arc chamber are mixed as contaminants is implanted into the wafer W, and thus there is a concern that the characteristics of a semiconductor device which is formed on the wafer W may be affected.

Further, under the condition that the arc voltage or the arc current is large, the amount of ions which are extracted from the arc chamber increases and an electric discharge easily occurs between the arc chamber and the extraction electrode. Depending on aspect of occurrence of the electric discharge, there is a concern that the arc chamber may be damaged, and in a case where the electric discharge or the damage occurs frequently, the life of the arc chamber is shortened, so that frequent maintenance of the apparatus is required. In that case, the operation rate of the ion implanter 100 is lowered and the production efficiency of a semiconductor device is lowered.

Therefore, in this embodiment, an ion generator is provided which can suppress mixing of contamination into the ion beam or damage to the arc chamber due to an electric discharge, even in a case of generating more multiply charged ions. In order to prevent mixing of contamination into the ion beam, it is important to increase the purity of the member configuring the arc chamber, and from the viewpoint of suppressing contamination, high-purity and refractory graphite is suitable. On the other hand, graphite is a material that is easily worn by plasma which is generated in the arc chamber, and carbon compounds which are generated by a reaction with the plasma are deposited on the surfaces of the constituent members of the ion generator, thereby causing dirt. Further, in use of graphite, an electric discharge more easily occurs than in use of a refractory metal material, and graphite is easily damaged when the electric discharge occurs. Therefore, in this embodiment, an ion generator capable of suppressing mixing of contamination and damage due to an electric discharge is provided by appropriately combining graphite and a refractory metal material, based on a difference in material characteristic.

Figure 2:
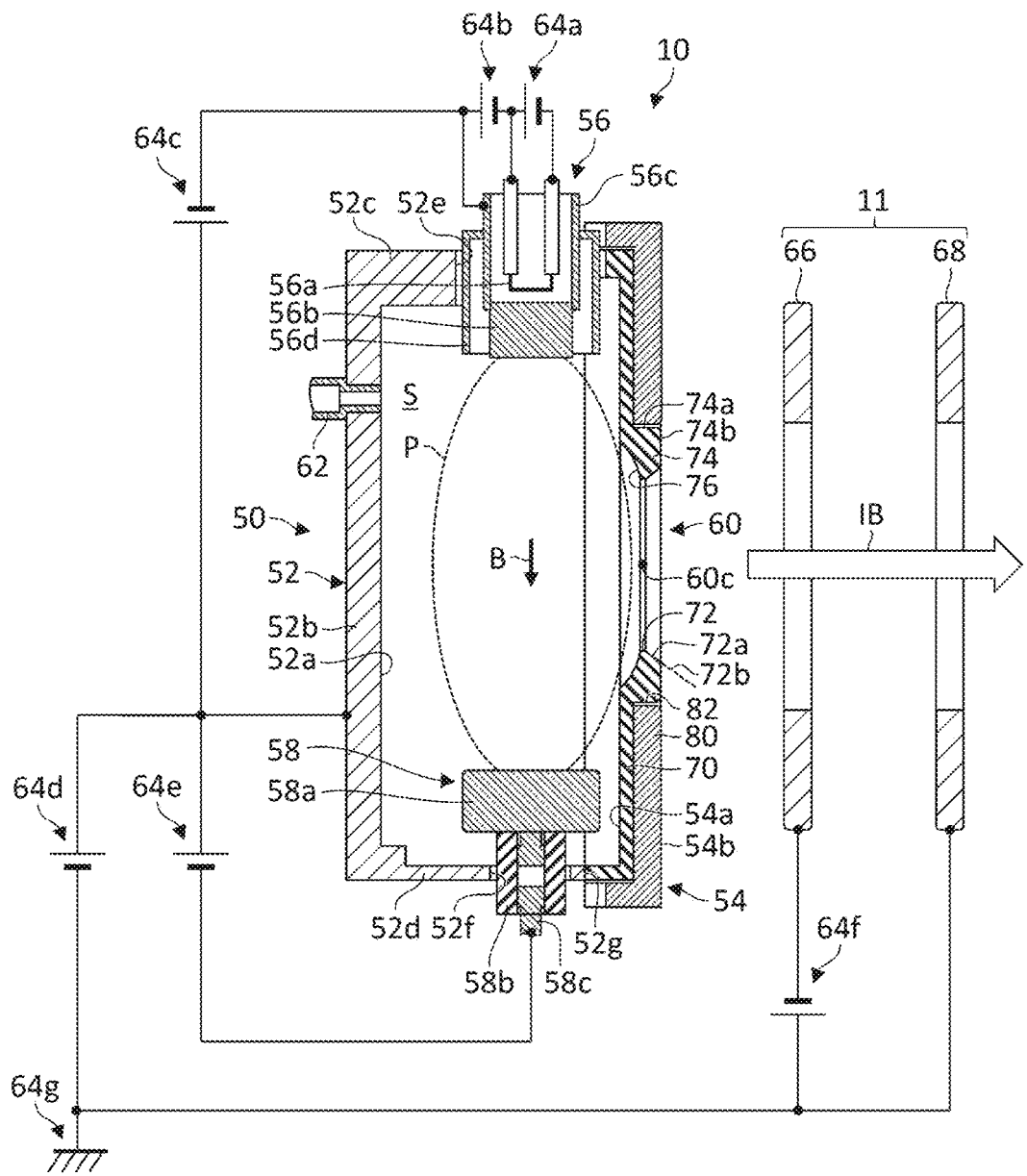
FIG. 2 is a sectional view showing a schematic configuration of an ion generator according to the embodiment.

FIG. 2 is a diagram showing a schematic configuration of the ion generator 10 according to the embodiment. The ion generator 10 is an indirectly heated ion source, and includes an arc chamber 50, a cathode 56, a repeller 58, and various power sources.

The extraction electrode 11 for extracting the ion beam IB through a front slit 60 of the arc chamber 50 is disposed in the vicinity of the ion generator 10. The extraction electrode 11 includes a suppression electrode 66 and a ground electrode 68. A suppression power source 64$f$ is connected to the suppression electrode 66, and a negative suppression voltage is applied to the suppression electrode 66. The ground electrode 68 is connected to ground 64$g$.

The arc chamber 50 has a substantially rectangular parallelepiped box shape. The arc chamber 50 defines a plasma generation space S in which plasma is generated. In the drawing, a plasma forming region P in which high-concentration plasma is formed is schematically shown by a broken line. The arc chamber 50 includes a box-shaped main body 52 on which a front side 52$g$ is open, and a slit member 54 which is mounted to the front side 52$g$ of the main body 52. The slit member 54 is provided with the front slit 60 for extracting the ion beam IB. The front slit 60 has an elongated shape extending in a direction (also referred to as an axial direction) from the cathode 56 toward the repeller 58. An extraction voltage which is positive with respect to the ground 64$g$ is applied to the arc chamber 50 by an extraction power source 64$d$.

The main body 52 has a back wall 52$b$ and four side walls including a first side wall 52$c$ and a second side wall 52$d$. The back wall 52$b$ is provided at a position facing the front slit 60 with the plasma generation space S interposed therebetween, and is disposed so as to extend in the axial direction. The back wall 52$b$ is provided with a gas introduction port 62 for introducing a source gas. The four side walls including the first side wall 52$c$ and the second side wall 52$d$ are provided so as to define a rectangular opening of the front side 52$g$ of the main body 52. The first side wall 52$c$ and the second side wall 52$d$ are disposed to face each other in the axial direction. The first side wall 52$c$ has a cathode insertion port 52$e$ extending in the axial direction, and the cathode 56 is disposed in the cathode insertion port 52$e$. The second side wall 52$d$ has a repeller insertion port 52$f$ extending in the axial direction, and the repeller 58 is disposed in the repeller insertion port 52$f$.

The main body 52 has an inner surface 52$a$ exposed to the plasma generation space S and made of a refractory metal material, and for example, refractory metal such as tungsten (W), molybdenum (Mo), or tantalum (Ta), or an alloy thereof is used. The entirety of the main body 52 may be made of a refractory metal material, or only the inner surface 52$a$ of the main body 52 may be selectively made of a refractory metal material. The main body 52 can be made of tungsten having a high melting point (about 3400° C.), for example. The purity of the refractory metal material which is used for the main body 52 may be a standard purity lower than that of other members (for example, the cathode 56 described later), and for example, the content rate of the refractory metal element is less than 99.99% by weight. An example of the refractory metal element content rate of the material which is used for the main body 52 is less than 99.8% by weight, less than 99.9% by weight, or less than 99.95% by weight.

The slit member 54 is a plate-shaped member in which the front slit 60 is provided. The slit member 54 is mounted to the front side 52$g$ of the main body 52 so as to close the opening of the front side 52$g$. The slit member 54 has an inner surface 54$a$ which is exposed to the plasma generation space S and is made of graphite, and an outer surface 54$b$ which is exposed to the outside of the arc chamber 50 is made of a refractory metal material. The slit member 54 has a double structure which includes an inner member 70 made of graphite and an outer member 80 made of a refractory metal material, and in which the inner member 70 and the outer member 80 overlap each other. The outer member 80 can be made of a refractory metal material having a standard purity, similar to the main body 52, and is made of tungsten, for example.

The inner member 70 has the inner surface 54$a$ which is exposed to the plasma generation space S. The inner member 70 has an inner opening 72 for forming the front slit 60, and has a protrusion portion 74 which protrudes toward the outside of the arc chamber 50 in the vicinity or on the periphery of the inner opening 72. The position of the outer surface 74$b$ of the protrusion portion 74 in the thickness direction (the direction from the inside toward the outside of the arc chamber 50) coincides with the position of the outer surface 54$b$ of the slit member 54 (or the outer member 80) in the thickness direction. A slit recess portion 76 is formed inside of the protrusion portion 74, and the inner surface 54$a$ of the inner opening 72 is separated from the plasma forming region P in the vicinity of the inner opening 72. The inner member 70 has a tapered surface 72$a$ provided at the edge of the inner opening 72 such that an opening size increases from the inside toward the outside of the arc chamber 50. The edge of the inner opening 72 is formed in a tapered shape, whereby the front slit 60 that hardly hinders the flow of the ion beam IB which is extracted from the inside toward the outside of the arc chamber 50 can be formed.

The outer member 80 has an outer surface 54$b$ which is exposed to the outside of the arc chamber 50, and is provided so as to face the extraction electrode 11 (the suppression electrode 66). The outer member 80 is a cover that covers the outside of the inner member 70, and has a role of supporting the inner member 70 made of graphite having a low mechanical strength to increase the strength. The outer member 80 has an outer opening 82 for forming the front slit 60. The opening size of the outer opening 82 is larger than the opening size of the inner opening 72. The opening size of the outer opening 82 is larger than the size of an outer periphery 74a of the protrusion portion 74. The opening size of the outer opening 82 may be substantially the same as the size of the outer periphery 74a of the protrusion portion 74, and for example, the outer opening 82 is configured such that the edge of the outer opening 82 is provided along the outer periphery 74a of the protrusion portion 74.

The outer member 80 is preferably configured so as not to hinder the extraction of the ion beam IB which passes through the inner opening 72. Specifically, it is preferable that the outer member 80 is configured such that the edge of the outer opening 82 is located at a position farther from a center 60c of the front slit 60 than a virtual plane 72b obtained by extending the tapered surface 72a of the inner opening 72 toward the outside of the arc chamber 50. As a result, the opening shape of the front slit 60 can be defined by only the inner opening 72, and the outer member 80 can be prevented from being exposed to the ion beam IB which is extracted from the arc chamber 50.

The cathode 56 emits thermoelectrons toward the plasma generation space S. The cathode 56 is inserted into the cathode insertion port 52e and fixed in a state where it is electrically insulated from the arc chamber 50. The cathode 56 includes a filament 56a, a cathode head 56b, a thermal break 56c, and a thermal reflector 56d.

The cathode head 56b is a solid columnar member, and the tip thereof is exposed to the plasma generation space S. The thermal break 56c is a cylindrical member that supports the cathode head 56b, and extends in the axial direction from the outside toward the inside of the arc chamber 50. The thermal break 56c desirably has a shape with high thermal insulation properties in order to maintain a high temperature state of the cathode head 56b, and has a thin shape. The thermal reflector 56d is a cylindrical member which is provided so as to surround the outer peripheries of the cathode head 56b and the thermal break 56c. The thermal reflector 56d reflects the radiant heat from the cathode head 56b and the thermal break 56c which are in a high temperature state, so that the high temperatures of the cathode head 56b and the thermal break 56c are maintained. The filament 56a is disposed so as to face the cathode head 56b in the interior of the thermal break 56c.

The filament 56a is heated by a filament power source 64a and generates thermoelectrons at the tip thereof. Primary thermoelectrons generated on the filament 56a are accelerated by a cathode voltage (for example, in a range of 300 to 600 V) of a cathode power source 64b, collide with the cathode head 56b, and heat the cathode head 56b with the energy which is generated due to the collision. The heated cathode head 56b generates secondary thermoelectrons, and the secondary thermoelectrons are accelerated by an arc voltage (for example, in a range of 70 to 150 V) applied between the cathode head 56b and the arc chamber 50 by an arc power source 64c. The accelerated secondary thermoelectrons are emitted toward the plasma generation space S as beam electrons having sufficient energy in order to ionize the source gas which is introduced from the gas introduction port 62 and generate plasma containing multiply charged ions. The beam electrons which are emitted toward the plasma generation space S are restrained by a magnetic field B which is applied to the plasma generation space S in the axial direction, and move spirally along the magnetic field B. By causing the electrons to move spirally in the plasma generation space S, it is possible to limit the movement of the electrons to the plasma forming region P and increase the plasma generation efficiency.

The cathode head 56b is made of a refractory metal material, for example, tungsten. The cathode head 56b may be made of a refractory metal material having purity higher than standard purity, and may have the refractory metal element content rate of 99.99% or more by weight. An example of the refractory metal element content rate of the material which is used for the cathode head 56b is 99.995% or more by weight, 99.9995% or more by weight, or 99.9999% or more by weight. The cathode head 56b is a member that is easily worn out by being exposed to high-concentration plasma, and is a member that easily causes mixing of contamination into the ion beam IB. By increasing the purity of the refractory metal material configuring the cathode head 56b, it is possible to reduce the influence of the mixing of contamination into the ion beam IB due to the ionization of the material configuring the cathode head 56b. At least one of the thermal break 56c and the thermal reflector 56d may be made of a refractory metal material having standard purity, or may be made of a refractory metal material having high purity, similar to the cathode head 56b.

The repeller 58 repels the electrons in the arc chamber 50 and causes the electrons to stay in the plasma forming region P to increase plasma generation efficiency. The repeller 58 is inserted into the repeller insertion port 52f and is fixed in a state of being electrically insulated from the arc chamber 50. A configuration is made such that a repeller voltage (for example, in a range of 120 to 200 V) is applied between the repeller 58 and the arc chamber 50 by a repeller power source 64e and electrons are repelled toward the plasma forming region P.

The repeller 58 includes a repeller head 58a, a repeller shaft 58b, and a repeller support part 58c. The repeller head 58a is provided inside of the arc chamber 50 and is provided at a position facing the cathode head 56b in the axial direction with the plasma generation space S interposed therebetween. The repeller support part 58c is provided outside of the arc chamber 50 and is fixed to a support structure (not shown). The repeller shaft 58b is a columnar member which is inserted into the repeller insertion port 52f, and connects the repeller head 58a and the repeller support part 58c. For example, female screws are formed in the repeller shaft 58b, male screws are formed on the repeller head 58a and the repeller support part 58c, and the repeller head 58a, the repeller shaft 58b, and the repeller support part 58c are connected to each other by a screw structure.

The repeller head 58a is made of a refractory metal material, for example, tungsten. The repeller head 58a may be made of a refractory metal material having high purity, similar to the cathode head 56b. The repeller head 58a is a member that is easily worn out by being exposed to high-concentration plasma, similar to the cathode head 56b, and thus, by increasing the purity of the material configuring the repeller head 58a, the influence of mixing of contamination into the ion beam IB can be reduced. In a case where the repeller head 58a is made of a refractory metal material, it is preferable that the repeller shaft 58b is made of graphite. In this way, the seizure of the repeller head 58a and the repeller shaft 58b which are connected to each other by the screw structure can be prevented. The repeller head 58a may be made of graphite.

Figure 3:
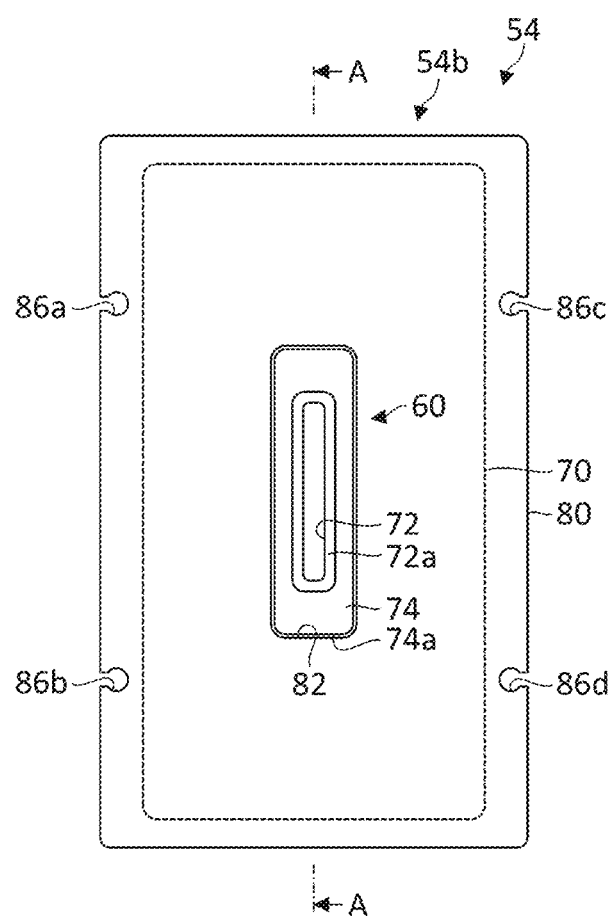
FIG. 3 is a plan view showing a schematic configuration of an outer surface side of a slit member.

FIG. 3 is a plan view showing a schematic configuration of the side of the outer surface 54b of the slit member 54 and shows a front view when the front slit 60 is viewed from the extraction electrode 11. The cross section taken along the line A-A in FIG. 3 corresponds to FIG. 2. The outer member 80 has a substantially rectangular external shape that is long in the axial direction. Further, the inner member 70 indicated by a broken line also has a substantially rectangular external shape that is long in the axial direction. The front slit 60 is provided at the center of the slit member 54, and an opening shape thereof is defined by the substantially rectangular inner opening 72 which is elongated in the axial direction. The outer periphery 74a of the protrusion portion 74 is also substantially rectangular, and the edge of the outer opening 82 is also substantially rectangular. The outer member 80 is configured to completely cover the inner member 70 except for the protrusion portion 74 in the vicinity of or around the front slit 60. Therefore, the external size of the outer member 80 is larger than the external size of the inner member 70 indicated by a broken line. Outer engagement portions 86a, 86b, 86c, and 86d for fixing the outer member 80 are provided at four locations on the outer periphery of the outer member 80. The outer engagement portions 86a to 86d are provided by two along each of two long sides of the outer periphery of the outer member 80.

Figure 4:
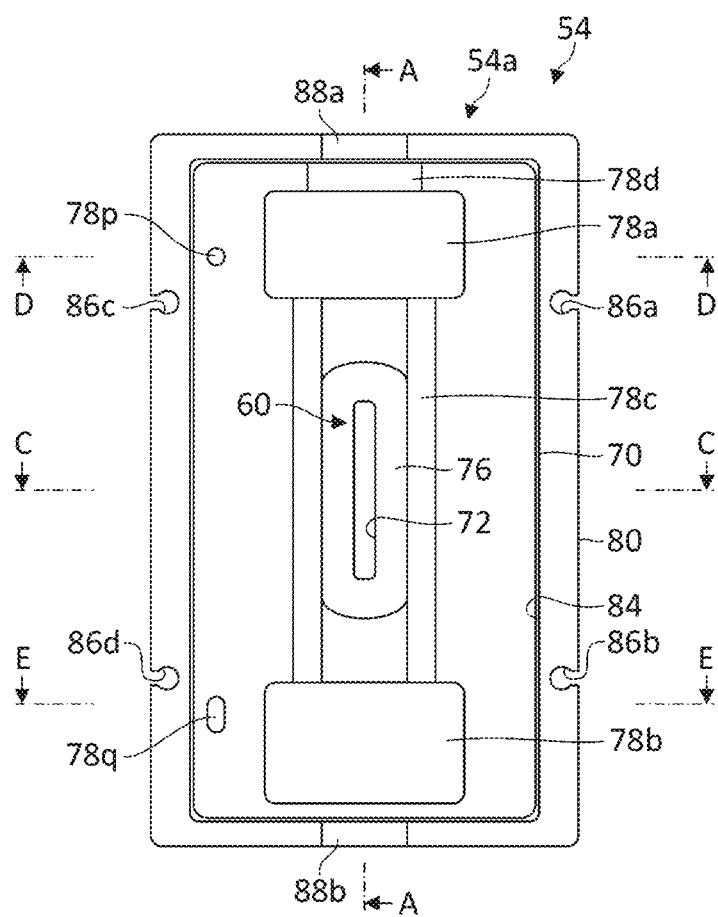
FIG. 4 is a plan view showing a schematic configuration of an inner surface side of the slit member.

FIG. 4 is a plan view showing a schematic configuration of the side of the inner surface 54a of the slit member 54 and shows a rear view when the front slit 60 is viewed from the plasma generation space S. The cross section taken along the line A-A in FIG. 4 corresponds to FIG. 2. A cathode accommodation recess portion 78a, a repeller accommodation recess portion 78b, and a central recess portion 78c are provided on the inner surface 54a of the inner member 70. The cathode accommodation recess portion 78a is provided at a position facing the cathode 56, and the repeller accommodation recess portion 78b is provided at a position facing the repeller 58. The central recess portion 78c extends in the axial direction along the front slit 60 and is provided so as to connect the cathode accommodation recess portion 78a and the repeller accommodation recess portion 78b. Each of the cathode accommodation recess portion 78a and the repeller accommodation recess portion 78b is configured such that the inner surface thereof facing each of the cathode 56 and the repeller 58 is a flat surface or a cylindrically curved surface. The central recess portion 78c is configured such that the inner surface thereof which is exposed to the plasma generation space S is a substantially cylindrically curved surface. The cathode accommodation recess portion 78a, the repeller accommodation recess portion 78b, and the central recess portion 78c are provided, whereby the distance from the plasma forming region P in which high-concentration plasma is generated to the inner surface 54a of the inner member 70 can be increased and wear of the inner surface 54a of the inner member 70 can be reduce.

A cathode outer periphery recess portion 78d is provided on the inner surface 54a of the inner member 70. The cathode outer periphery recess portion 78d is provided at a position facing the cathode 56 on the outer periphery of the inner member 70. The cathode outer periphery recess portion 78d is configured to have a cylindrically curved surface corresponding to the cylindrical cathode 56. The cathode outer periphery recess portion 78d is separated from the cathode 56 to secure the electrical insulation between the cathode 56 and the slit member 54.

Inner engagement portions 78p and 78q are provided on the inner surface 54a of the inner member 70. The inner engagement portions 78p and 78q engage with main body engagement portions which are provided on the main body 52 of the arc chamber 50, thereby regulating the position of the inner member 70 with respect to the main body 52. The inner engagement portions 78p and 78q are recess portions which are provided on the inner surface 54a of the inner member 70, and the main body engagement portions protruding from the main body 52 are inserted into the inner engagement portions 78p and 78q. A first inner engagement portion 78p is provided in the vicinity of the cathode accommodation recess portion 78a, and a second inner engagement portion 78q is provided in the vicinity of the repeller accommodation recess portion 78b. The first inner engagement portion 78p is formed such that a size in the axial direction is substantially the same as a size in a horizontal direction perpendicular to the axial direction. On the other hand, the second inner engagement portion 78q is formed in a shape long in the axial direction, and the size in the axial direction is larger than the size in the horizontal direction. The shapes of the first inner engagement portion 78p and the second inner engagement portion 78q are not limited to those shown in the drawing, and may be other shapes as long as the position of the inner member 70 can be regulated by engagement with the main body engagement portions.

An inner member accommodation recess portion 84, a first outer periphery recess portion 88a, and a second outer periphery recess portion 88b are provided on the outer member 80. The inner member accommodation recess portion 84 has a size corresponding to the external shape of the inner member 70 and accommodates the inner member 70. The first outer periphery recess portion 88a is provided at a position facing the cathode 56 on the outer periphery of the outer member 80 and is configured to have a cylindrically curved surface corresponding to the cylindrical cathode 56. The first outer periphery recess portion 88a is separated from the cathode 56 to secure the electrical insulation between the cathode 56 and the slit member 54. The second outer periphery recess portion 88b is provided at a position facing the repeller 58 on the outer periphery of the outer member 80. The second outer periphery recess portion 88b is configured to have the same shape and size as the first outer periphery recess portion 88a and is configured such that the outer member 80 has a vertically symmetrical shape. Therefore, the outer member 80 can be used upside down and can also be mounted such that the first outer periphery recess portion 88a and the repeller 58 face each other and the second outer periphery recess portion 88b and the cathode 56 face each other. The second outer periphery recess portion 88b may not be provided on the outer member 80. The repeller shaft 58b which can face the second outer periphery recess portion 88b has a smaller radial size (that is, is thinner) than that of the repeller head 58a, and thus, even if the second outer periphery recess portion 88b is not provided, the electrical insulation between the repeller 58 and the slit member 54 can be sufficiently secured.

Figure 5:
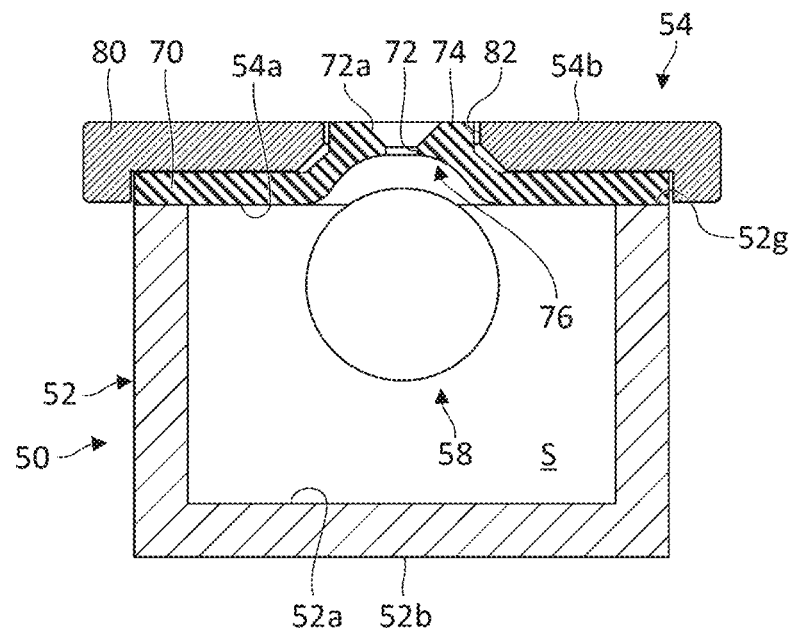
FIG. 5 is a sectional view showing a schematic configuration of an arc chamber.

FIG. 5 is a sectional view showing a schematic configuration of the arc chamber 50 and shows a cross section perpendicular to the axial direction at the center 60c of the front slit 60. FIG. 5 corresponds to the cross section taken along the line C-C in FIG. 4 and shows a cross section when the repeller 58 is viewed from the cathode 56. As shown in the drawing, the repeller 58 is disposed so as to protrude outward from the front side 52g of the main body 52, and a part of the repeller 58 overlaps the slit member 54 in the axial direction. The cathode 56 is also disposed, similar to the repeller 58, so as to protrude outward from the front side 52g of the main body 52, and a part of the cathode 56 overlaps the slit member 54 in the axial direction. The protrusion portion 74 protrudes toward the outside of the arc chamber 50 around the inner opening 72, and the slit recess portion 76 is provided inside of the protrusion portion 74. The slit recess portion 76 is configured to be separated from the cathode 56 and the repeller 58 in the radial direction perpendicular to the axial direction so as not to overlap the cathode 56 and the repeller 58 in the axial direction.

Figure 6:
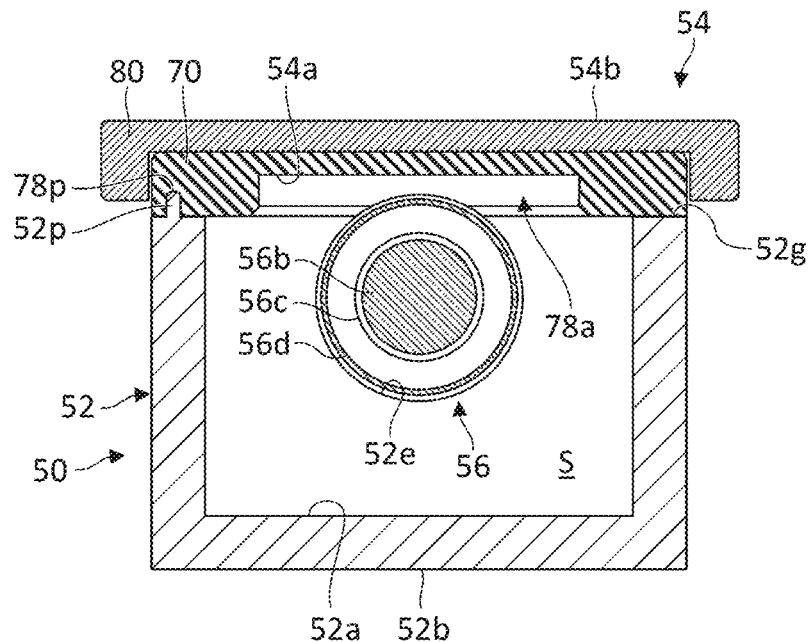
FIG. 6 is a sectional view showing the schematic configuration of the arc chamber.

FIG. 6 is a sectional view showing a schematic configuration of the arc chamber 50 and corresponds to the cross section taken along the line D-D in FIG. 4. FIG. 6 shows a cross section perpendicular to the axial direction at a position corresponding to the cathode accommodation recess portion 78a and the first inner engagement portion 78p. As shown in the drawing, the cathode 56 is disposed so as to protrude outward from the front side 52g of the main body 52, and a part of the cathode 56 is disposed inside of the cathode accommodation recess portion 78a. Further, the main body 52 is provided with a first main body engagement portion 52p protruding from the front side 52g. The first main body engagement portion 52p engages with the corresponding first inner engagement portion 78p to regulate the position of the inner member 70.

Figure 7:
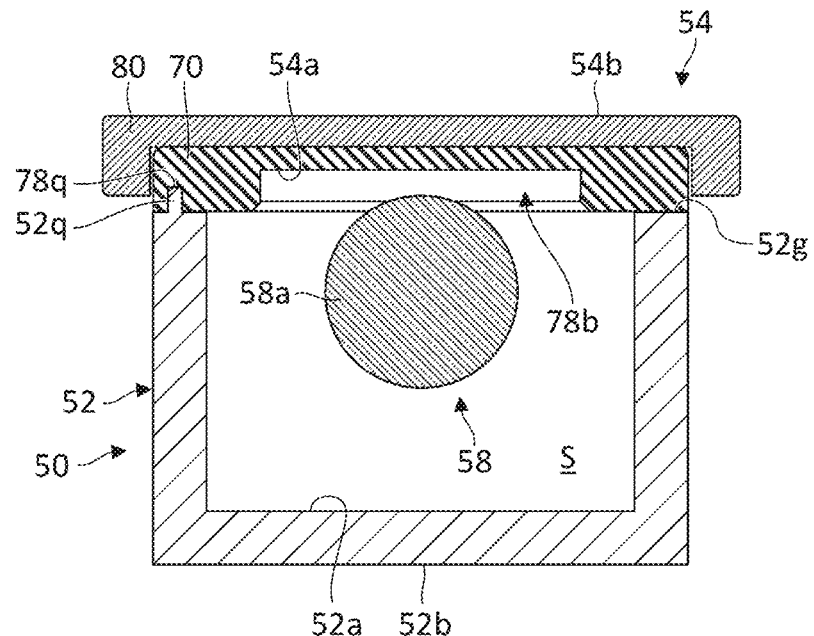
FIG. 7 is a sectional view showing the schematic configuration of the arc chamber.

FIG. 7 is a sectional view showing a schematic configuration of the arc chamber 50 and corresponds to the cross section taken along line the E-E in FIG. 4. FIG. 7 shows a cross section perpendicular to the axial direction at a position corresponding to the repeller accommodation recess portion 78b and the second inner engagement portion 78q. As shown in the drawing, the repeller 58 is disposed so as to protrude outward from the front side 52g of the main body 52, and a part of the repeller 58 is disposed inside of the repeller accommodation recess portion 78b. Further, the main body 52 is provided with a second main body engagement portion 52q protruding from the front side 52g. The second main body engagement portion 52q engages with the corresponding second inner engagement portion 78q to regulate the position of the inner member 70.

Figure 8:
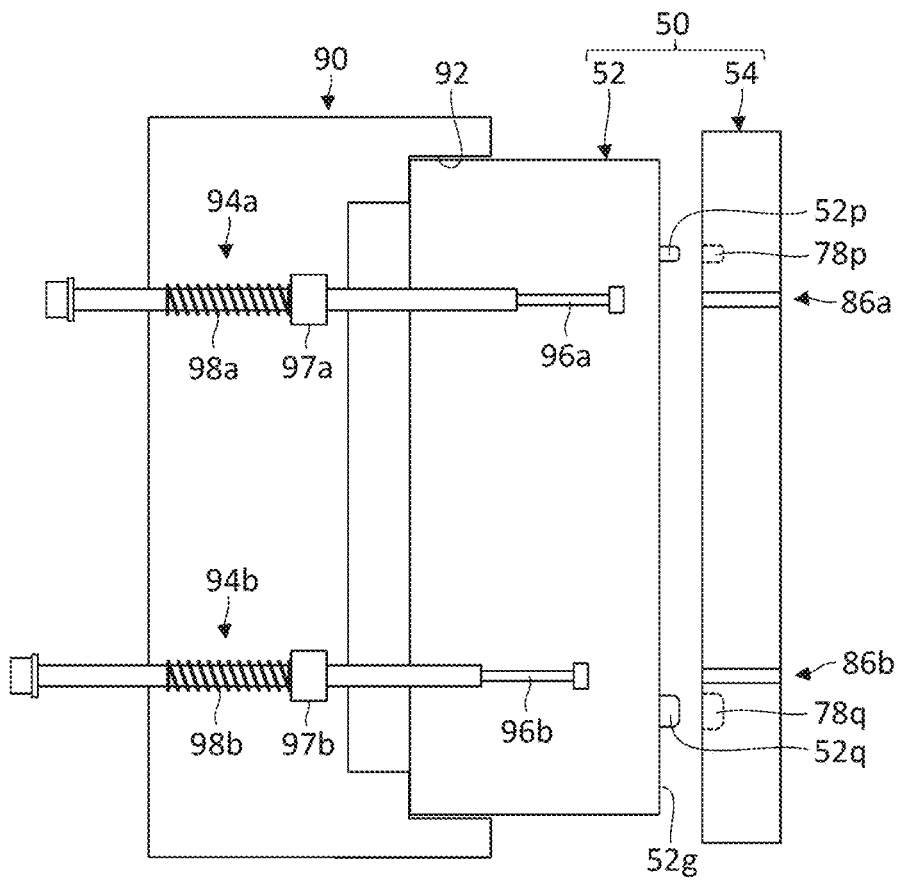
FIG. 8 is a side view schematically showing a method of fixing the slit member.
Figure 9:
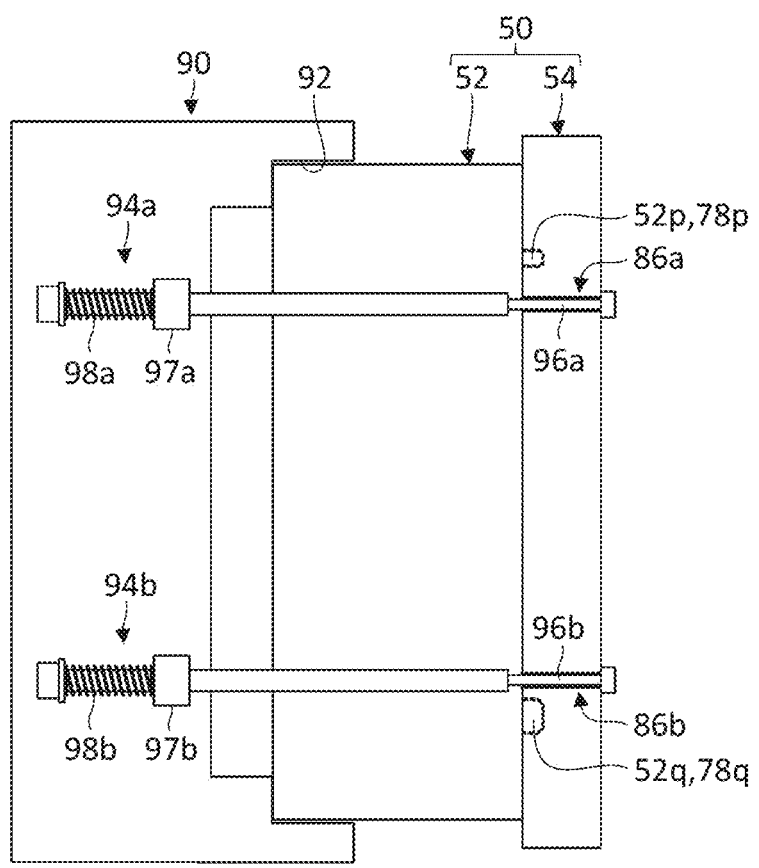
FIG. 9 is a side view schematically showing the method of fixing the slit member.

FIGS. 8 and 9 are side views schematically showing a method of fixing the slit member 54. FIG. 8 shows a state where the slit member 54 is released from the main body 52, and FIG. 9 shows a state where the slit member 54 is fixed to the main body 52. The arc chamber 50 is fixed to a structure 90. The structure 90 is provided with an accommodation recess portion 92 which accommodates and supports the main body 52, and locking structures 94a and 94b for fixing the slit member 54. The locking structures 94a and 94b engage with the outer engagement portions 86a and 86b provided on the outer member 80, and the slit member 54 is fixed to the main body 52 by applying a tensile force toward the main body 52 to the outer member 80. The first locking structure 94a includes a first rod 96a having a tip portion which engages with the first outer engagement portion 86a, a first bearing portion 97a which supports the first rod 96a, and a first spring 98a for applying a tensile force to the first rod 96a. The first rod 96a is configured to be displaceable in a longitudinal direction and a direction perpendicular to the longitudinal direction with the first bearing portion 97a as a support point, and is configured such that a disposed angle of the first rod 96a is variable in a direction away from the arc chamber 50 and a direction approaching the arc chamber 50 at the time of mounting and dismounting of the first rod 96a.

The second locking structure 94b is configured in the same manner as the first locking structure 94a and includes a second rod 96b, a second bearing portion 97b, and a second spring 98b. The second locking structure 94b engages with the second outer engagement portion 86b to fix the slit member 54 with respect to the main body 52. The structure 90 is provided with a third locking structure and a fourth locking structure (not shown). The third locking structure engages with the third outer engagement portion 86c shown in FIG. 3, and the fourth locking structure engages with the fourth outer engagement portion 86d shown in FIG. 3. The slit member 54 is pulled toward the main body 52 by the four locking structures and is fixed with respect to the main body 52. At this time, the first main body engagement portion 52p and the first inner engagement portion 78p engage with each other and the second main body engagement portion 52q and the second inner engagement portion 78q engage with each other, whereby the inner member 70 is accurately positioned with respect to the main body 52.

Next, the operational effects which the ion generator 10 exhibits will be described. According to this embodiment, the inner surface 54a of the slit member 54 is made of graphite and the front slit 60 is defined by the inner opening 72 made of graphite, whereby mixing of contamination into the ion beam IB can be minimized. The inner surface 54a of the slit member 54 is a location which is exposed to high-concentration plasma in the plasma forming region P, and it can be said that the inner surface 54a is a location where the contribution of mixing of contamination into the ion beam IB which is extracted from the front slit 60 is the largest. By using graphite in such a location, it is possible to suitably suppress the mixing of contamination into the ion beam IB, and in particular, the mixing of metal elements of the refractory metal material itself or trace amounts of metal elements contained in the refractory metal material can be effectively suppressed.

According to this embodiment, the cathode head 56b and the repeller head 58a are made of a refractory metal material, whereby it is possible to reduce wear due to plasma as compared with a case where these members are made of graphite, and to reduce dirt that can be deposited inside of the arc chamber 50. Further, by increasing the purity of the refractory metal material configuring the cathode head 56b and the repeller head 58a, it is possible to suitably suppress mixing of contamination into the plasma which is generated in the plasma forming region P. Further, the inner surface 52a of the main body 52 which is not easily worn by plasma is made of a refractory metal material having standard purity, whereby it is possible to suitably suppress mixing of contamination into the plasma which is generated in the plasma forming region P while suppressing an increase in cost due to high purification.

According to this embodiment, a cover that is the outer member 80 made of a refractory metal material is mounted to the side of outer surface 54b of the slit member 54, whereby an electric discharge that can occur between the slit member 54 and the extraction electrode 11 can be suppressed and damage due to the electric discharge can also be suppressed. In particular, by reducing the exposed area of the outer surface 74b of the protrusion portion 74 around the inner opening 72 as much as possible, it is possible to enhance the effect of suppressing an electric discharge due to the graphite being exposed to the extraction electrode 11 and as a result, it is also possible to enhance the effect of suppressing damage due to the electric discharge. Further, the edge of the outer opening 82 of the outer member 80 is provided at a position farther from the center 60c of the front slit 60 than the tapered surface 72a and the virtual plane 72b of the inner opening 72, whereby mixing of contamination attributed to the outer member 80 into the ion beam IB which is extracted from the front slit 60 can be suppressed.

According to this embodiment, the cathode accommodation recess portion 78a, the repeller accommodation recess portion 78b, and the center recess portion 78c are provided on the inner member 70, whereby the cathode 56 and the repeller 58 can be disposed closer to the slit member 54 while increasing mechanical strength by increasing the thickness of the outer periphery of the inner member 70. As a result, the distance from the plasma forming region P interposed between the cathode 56 and the repeller 58 to the front slit 60 can be shortened, and the extraction efficiency of multiply charged ions which are generated more in the vicinity of the center of the plasma forming region P can be increased. In this way, more multiply charged ions can be supplied to the downstream of the ion generator 10. Further, in conditions where the supply amounts of multiply charged ions are approximately the same, by adopting the configuration of this embodiment, an arc voltage or an arc current can be relatively reduced, and thus wear of the arc chamber or an electric discharge between the arc chamber and the extraction electrodes can be suppressed.

The present invention has been described above with reference to the embodiment. However, the present invention is not limited to the embodiment described above, and appropriate combinations or replacements of the configurations of the embodiment are also included in the present invention. Further, it is also possible to appropriately rearrange the combination or the processing order in the embodiment or to add modifications such as various design changes to the embodiment, based on the knowledge of those skilled in the art, and embodiments to which such rearrangement or modifications are added can also be included in the scope of the present invention.

It should be understood that the invention is not limited to the above-described embodiment, but may be modified into various forms on the basis of the spirit of the invention. Additionally, the modifications are included in the scope of the invention.

What is claimed is:

1. An ion generator comprising:
an arc chamber which defines a plasma generation space; and
a cathode which emits thermoelectrons toward the plasma generation space, wherein
the arc chamber includes a box-shaped main body which includes an opening in at least part of a front side of the main body, and a slit member which is mounted to cover the opening of the front side of the main body and provided with a front slit for extracting ions,
an inner surface of the main body which is exposed to the plasma generation space is made of a first refractory metal material,
the slit member includes an inner member made of graphite, and an outer member made of a second refractory metal material,
the outer member includes an outer surface which is exposed to an outside of the arc chamber, and
the inner member includes an inner surface which is exposed to the plasma generation space and an opening portion which forms the front slit extending from the inner surface of the inner member to the outer surface of the outer member.

2. The ion generator according to claim 1, wherein
the outer member is provided with an outer opening for forming the front slit, and
an opening size of the outer opening is larger than an opening size of the inner opening.

3. The ion generator according to claim 2, wherein
the inner member includes a tapered surface which is provided at an edge of the inner opening such that an opening size increases from an inside toward an outside of the arc chamber, and
an edge of the outer opening is provided at a position farther from a center of the front slit than a virtual plane obtained by extending the tapered surface toward the outside of the arc chamber.

4. The ion generator according to claim 2, wherein
the inner member includes a protrusion portion which protrudes toward the outside of the arc chamber on a periphery of the inner opening, and
an edge of the outer opening is provided along an outer periphery of the protrusion portion of the inner member.

5. The ion generator according to claim 4, wherein a position of an outer surface of the outer member on a periphery of the outer opening in a thickness direction from the inside toward the outside of the arc chamber coincides with a front surface of the protrusion portion of the inner member which is exposed to the outside of the arc chamber.

6. An ion implanter comprising:
an ion generator that comprises an arc chamber which defines a plasma generation space, and a cathode which emits thermoelectrons toward the plasma generation space, wherein
the arc chamber includes a box-shaped main body which includes an opening in at least part of a front side of the main body, and a slit member which is mounted to cover the opening of the front side of the main body and provided with a front slit for extracting ions,
an inner surface of the main body which is exposed to the plasma generation space is made of a first refractory metal material,
the slit member includes an inner member made of graphite, and an outer member made of a second refractory metal material,
the outer member includes an outer surface which is exposed to an outside of the arc chamber, and
the inner member includes an inner surface which is exposed to the plasma generation space and an opening portion which forms the front slit extending from the inner surface of the inner member to the outer surface of the outer member.

7. The ion implanter according to claim 6, wherein the first refractory metal material includes the same refractory metal element as the second refractory metal material.

8. The ion implanter according to claim 6, wherein
the inner opening portion includes an exposed portion which is exposed to the outside of the arc chamber, and the outer member surrounds the exposed portion.

9. The ion implanter according to claim 8, wherein at least part of the outer member faces the inner member in a thickness direction from the inside toward the outside of the arc chamber.

10. An ion implanter comprising:
a beam generation unit that comprises an ion generator to generate multiply charged ions, and that generates an ion beam of the multiply charged ions extracted from the ion generator;
a beam acceleration unit that accelerates the ion beam to obtain a high energy ion beam of 1 MeV or more; and
a substrate processing unit in which the high-energy ion beam is implanted into a substrate, wherein
the ion generator includes an arc chamber which defines a plasma generation space, and a cathode which emits thermoelectrons toward the plasma generation space,
the arc chamber includes a box-shaped main body which includes an opening in at least a part of a front side of the main body, and a slit member which is mounted to cover the opening of the front side of the main body and provided with a front slit for extracting ions, an inner surface of the main body which is exposed to the plasma generation space is made of a refractory metal material, and an inner surface of the slit member which is exposed to the plasma generation space is made of graphite.

11. The ion implanter according to claim 10, wherein the beam acceleration unit comprises a linear accelerator.

12. The ion implanter according to claim 10, wherein the beam acceleration unit comprises a plurality of linear accelerators.

13. The ion implanter according to claim 10, wherein the beam acceleration unit accelerates the ion beam to obtain a high energy ion beam of 4 MeV or more.

14. The ion implanter according to claim 10, wherein the ion generator generates the multiply charged ions of at least one of boron, phosphorus, and arsenic.

* * * * *